United States Patent
Abe et al.

(10) Patent No.: US 8,212,579 B2
(45) Date of Patent: Jul. 3, 2012

(54) FIXING APPARATUS FOR A PROBE CARD

(75) Inventors: Yoshihiro Abe, Tokyo (JP); Shigeru Matsumura, Tokyo (JP)

(73) Assignee: Advantest Corporation, Tokyo (JP)

( * ) Notice: Subject to any disclaimer, the term of this patent is extended or adjusted under 35 U.S.C. 154(b) by 123 days.

(21) Appl. No.: 12/598,216

(22) PCT Filed: May 22, 2008

(86) PCT No.: PCT/JP2008/059457
§ 371 (c)(1), (2), (4) Date: Oct. 30, 2009

(87) PCT Pub. No.: WO2008/146705
PCT Pub. Date: Dec. 4, 2008

(65) Prior Publication Data
US 2010/0127726 A1 May 27, 2010

(30) Foreign Application Priority Data
May 31, 2007 (JP) .................. 2007-145410

(51) Int. Cl.
G01R 31/20 (2006.01)
G01R 31/02 (2006.01)
G01R 31/00 (2006.01)
(52) U.S. Cl. .......... 324/754.11; 324/762.01; 324/756.01
(58) Field of Classification Search .. 324/754.01–754.3, 324/762.01–762.09, 755.01–755.11, 765.01–765.07; 257/48; 438/14–18
See application file for complete search history.

(56) References Cited

U.S. PATENT DOCUMENTS

| 7,119,564 B2 * | 10/2006 | Martens et al. .......... 324/750.23 |
| 7,164,280 B2 | 1/2007 | Bohm |
| 7,307,435 B2 * | 12/2007 | Mori ........................ 324/756.03 |
| 2005/0253608 A1 | 11/2005 | Bohm |
| 2006/0061375 A1 | 3/2006 | Mori |

FOREIGN PATENT DOCUMENTS

| CN | 1696708 | 11/2005 |
| JP | 2005-328053 | 11/2005 |
| JP | 2007-057438 | 3/2007 |

OTHER PUBLICATIONS

English language Abstract of JP 2005-328053, Nov. 24, 2005.
English language Abstract of JP 2007-057438, Mar. 8, 2007.
Taiwan Office action, mail date is Dec. 6, 2011.

* cited by examiner

*Primary Examiner* — Huy Q Phan
*Assistant Examiner* — Tung X Nguyen
(74) *Attorney, Agent, or Firm* — Greenblum & Bernstein P.L.C.

(57) ABSTRACT

A fixing apparatus for fixing a probe card to a holder includes a screw fixed to the holder and binding the probe card onto the holder in a vertical direction, a first bearing member intervening between a head of the screw and the probe card and allowing expansion and contraction of the probe card with respect to the screw in a horizontal direction, and a second bearing member intervening between the probe card and the holder and allowing expansion and contraction of the probe card with respect to the holder in the horizontal direction.

8 Claims, 7 Drawing Sheets

FIXING APPARATUS FOR A PROBE CARD

TECHNICAL FIELD

The present invention relates to a fixing apparatus for fixing to a holder a probe card to be used in a test of various types of electronic device (hereinafter referred also to as representatively "IC device") such as an integrated circuit device formed on a semiconductor wafer.

BACKGROUND ART

In a production process of electronic devices, such as IC devices, there has been used an electronic device testing apparatus for testing performances and functional capabilities of IC devices in a situation where IC devices are embedded on a semiconductor wafer or packaged.

As the apparatus for testing electrical characteristics of an IC device embedded on a semiconductor wafer W under test, as shown in FIG. 6, one which pushes a wafer W by a prober 90 against a probe card 50 and tests the electrical characteristics of the IC device by a tester (not shown) via the probe card 50 and the test head 10 in the state bringing probe needles 51 mounted on the probe card 50 into electrical contact with electrodes of the IC device.

A heat source 94 is provided in the prober 90. Due to heating and cooling the semiconductor wafer W by the heater, a test of the IC device is executed under the condition where a predetermined heat stress is applied on the semiconductor wafer W.

Meanwhile, the probe card 50 is tightly fixed to a holder 70 by using screws 55 or the like at a peripheral portion thereof. Accordingly, when there occurs a thermal expansion or a thermal contraction in the probe card 50 in accordance with a temperature change of the semiconductor wafer W, the probe card 50 deforms in the vertical direction, as shown in FIGS. 7A to 7C, thereby front ends of the probe pins 51 fluctuate in their heights. As a result, contact pressures of the probe needles 51 pressed to the electrodes on the semiconductor wafer W under test fluctuate, and it may be difficult to perform a test in high accuracy.

DISCLOSURE OF INVENTION

Problems to be Solved by the Invention

The object of the present invention is to provide a fixing apparatus for a probe card which can suppress the fluctuation in heights of the front ends of the probe needles.

Means for Solving the Problems

In order to achieve the object, in accordance with the present invention, there is provided a fixing apparatus for fixing to a holder a probe card to be used in a test of a device under test formed on a semiconductor wafer, wherein the probe card is provided stretchably with respect to the holder in a direction substantially parallel to a main surface of the probe card, and the probe card is bound onto the holder in a direction substantially perpendicular to the main surface of the probe card (refer to claim 1).

Although not limited in the present invention, it is preferable that the fixing apparatus comprises: a binding means for binding the probe card onto the holder in the direction substantially perpendicular to the main surface of the probe card; and an allowing means for allowing expansion and contraction of the probe card with respect to the holder in the direction substantially parallel to the main surface of the probe card (refer to claim 2).

Although not limited in the present invention, it is preferable that the binding means is fixed to the holder, and the allowing means includes: a first bearing member intervening between the binding means and the probe card and allowing expansion and contraction of the probe card with respect to the binding means in the parallel direction; and a second bearing member intervening between the probe card and the holder and allowing expansion and contraction of the probe card with respect to the holder in the parallel direction (refer to claim 3).

Although not limited in the present invention, it is preferable that the binding means includes a screw member being fixed to the holder via a through-hole formed on a stiffener of the probe card (refer to claim 4).

Although not limited in the present invention, it is preferable that the binding means is fixed to the probe card, and the allowing means includes: a first bearing member intervening between the binding means and the holder and allowing a small movement of the binding means with respect to the holder in the parallel direction; and a second bearing member intervening between the holder and the probe card and allowing expansion and contraction of the probe card with respect to the holder in the parallel direction (refer to claim 5).

Although not limited in the present invention, it is preferable that the binding means includes a screw member being fixed to a stiffener of the probe card via passing through a through-hole formed on the holder (refer to claim 6).

Although not limited in the present invention, it is preferable that the fixing apparatus comprises: a guiding member provided on one of the probe card or the holder along the direction substantially parallel to the main surface of the probe card; and a sliding member provided on another of the holder or the probe card, engaged with the guiding member in the direction perpendicular to the main surface of the probe card and being able to slide on the guiding member (refer to claim 7).

In order to achieve the object, in accordance with the present invention, there is provided a testing apparatus for an electronic device, comprising: a testing apparatus main frame for testing a device under test formed on a semiconductor wafer; a probe card for establishing an electrical connection between the device under test and the testing apparatus main frame; a prober for pressing the probe card onto the semiconductor wafer; and a holder for fixing the probe card to the prober. The probe card is fixed to the holder by using the above-described fixing apparatuses (refer to claim 8).

Advantageous Effect of the Invention

According to the present invention, the fixing apparatus allows the deformation of the probe card caused by thermal expansion or thermal contraction thereof to escape in the horizontal direction. Therefore, the deformation of the probe card in the vertical direction is reduced, and the front ends of the probe needles become less variation in their heights.

DESCRIPTION OF REFERENCE NUMERALS

Figure 1:
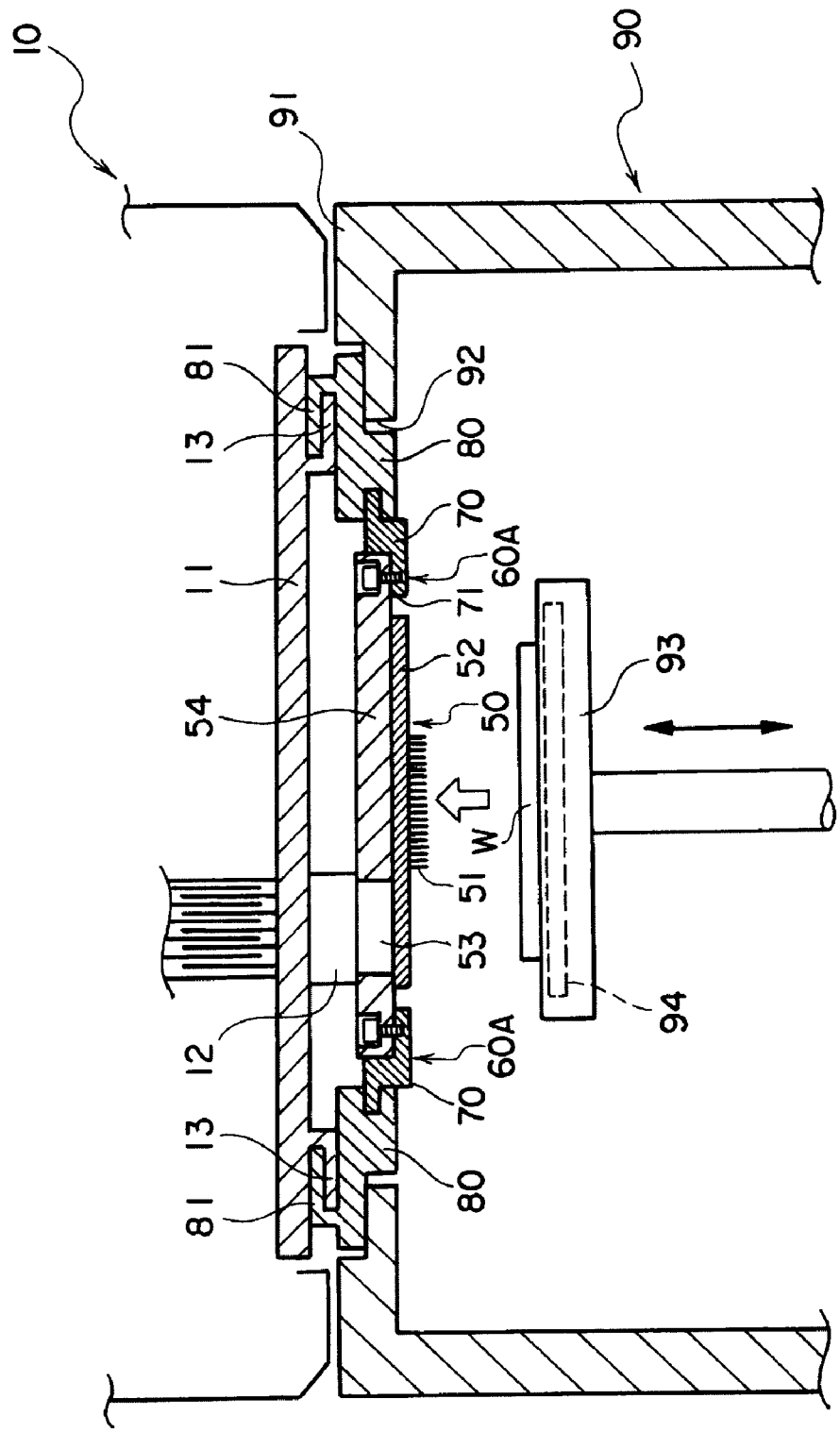
FIG. 1 is a schematic sectional view illustrating a structure of an electronic device testing apparatus according to a first embodiment of the present invention.

10; test head
50; probe card
51; probe pin
54; stiffener
60A to 60C; fixing apparatus
61; screw
62; first bearing member
63; second bearing member
64; screw
65; first bearing member
66; second bearing member
67; linear guide
70; holder
80; adapter
90; prober
W; semiconductor wafer under test

BEST MODE FOR CARRYING OUT THE INVENTION

Hereinafter, embodiments of the present invention will be described with reference to the drawings.

Figure 2:
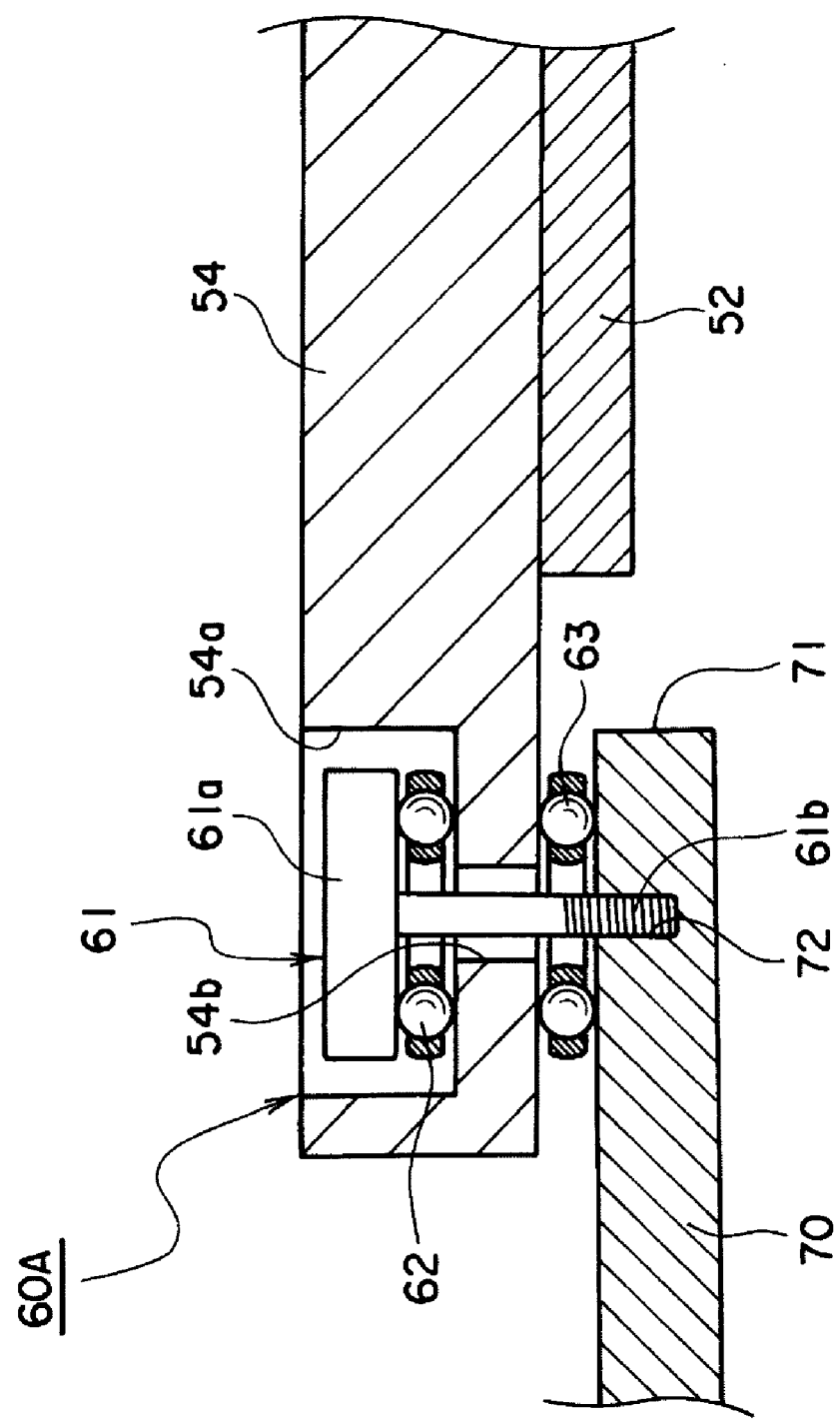
FIG. 2 is a schematic sectional view illustrating a fixing apparatus according to the first embodiment of the present invention.
Figure 3:
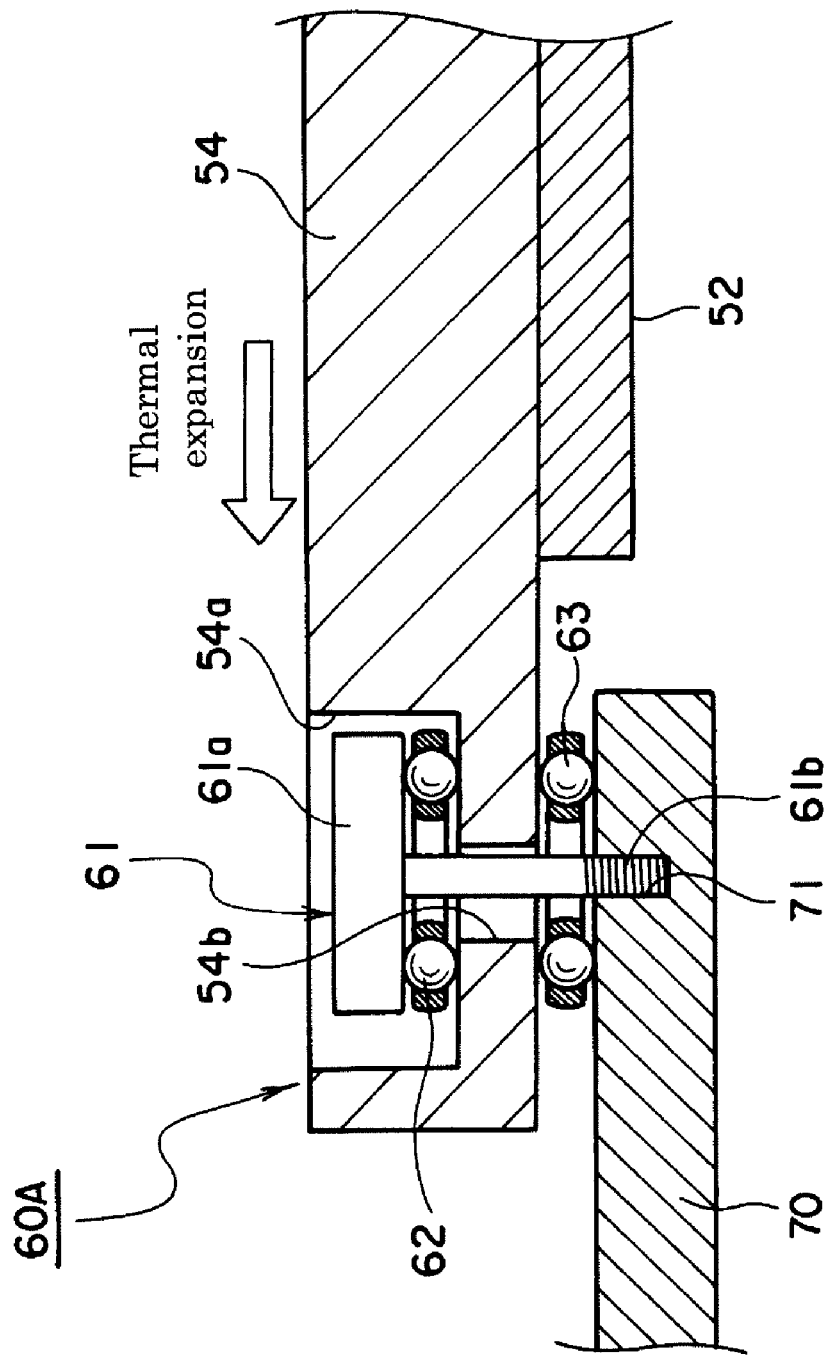
FIG. 3 is a sectional view illustrating the fixing apparatus according to the first embodiment of the present invention in case that a probe card thermally expands.

FIG. 1 is a schematic sectional view illustrating a structure of an electronic device testing apparatus according to a first embodiment of the present invention, FIG. 2 is a schematic sectional view illustrating a fixing apparatus according to the first embodiment of the present invention, and FIG. 3 is a sectional view illustrating the fixing apparatus according to the first embodiment of the present invention in case that a probe card thermally expands.

An electronic device testing apparatus 1 according to the first embodiment of the present invention is an apparatus for testing electrical characteristics of an IC device embedded on a semiconductor wafer W under test. As shown in FIG. 1, the electronic device testing apparatus 1 has a test head 10 electrically connected through a cable with a tester (not shown) for testing the IC device, a probe card 50 for establishing an electrical connection between the IC device on the semiconductor wafer W under test and the test head 10, and a prober 90 for pressing the semiconductor wafer W under test onto the probe card 50.

The probe card 50 is, as shown in FIG. 1, electrically connected with the test head 10 through a Hifix 11. The probe card 50 is configured to have a large number of probe needles 51 to be electrically contacted with electrodes of the IC device embedded on the semiconductor wafer W under test, a printed circuit board 52 on which the probe needles 51 are mounted, a plurality of connectors 53 for electrically connecting the probe card 50 to connectors 12 provided on the Hifix 11 side, and a stiffener 54 for reinforcing the probe card 50.

As shown in the figure, the probe needles 51 are mounted on a approximately center area of one main surface of the printed circuit board 52, and arranged so as to correspond to the electrodes of the IC device embedded on the semiconductor wafer W under test. In contrast, the connectors 53 and the stiffener 54 are provided on the other main surface of the printed circuit board 52, and each probe needle 51 is electrically connected to the connector 53 via a wiring pattern formed in the printed circuit board 52.

The probe card 50 is held by a ring shaped holder 70 in a posture such that the probe pins 51 faces downward through a center opening 71 of the holder 70. The probe card 50 is fixed to the holder 70 by means of fixing apparatuses 60A at several peripheral positions thereof.

Each fixing apparatus 60A includes, as shown in FIG. 2, a screw 61 and two bearing members 62 and 63.

The screw 61 is fixed at a thread portion 61b to a fix hole 72 formed on the holder 70 via a through-hole 54b formed in the stiffener 54 of the probe card 50. Because A head 61a of the screw 61 has an outer diameter which is larger than the inner diameter of the through-hole 54b of the stiffener 54, by fixing the screw 61 to the holder 70, the screw 61 binds the probe card 50 with respect to the holder 70 in the vertical direction. It is to be noted that the through-hole 54b of the stiffener 54 is formed so as to have a diameter slightly larger than the diameter of the thread portion 61b of the screw 61 in order to allow the probe card 50 to have a stretchability with respect to the screw 61 in the horizontal direction. In addition, the head 61a of the screw 61 is positioned in a recessed area 54a of the stiffener 54.

The first bearing member 62 is configured to have a plastic frame and a plurality of balls supported by the plastic frame such that the plurality of balls are rotatably arranged in a circular pattern. The first bearing member 62 has an inner opening in which the thread portion 61b of the screw 61 is inserted, and intervenes between the head 61a of the screw 61 and the stiffener 54. The first bearing member 62 allows the probe card 50 to have a stretchability with respect to the screw 61 in the horizontal direction.

Similarly, the second bearing member 63 is configured to have a plastic frame and a plurality of balls supported by the plastic frame such that the plurality of balls are rotatably arranged in a circular pattern. The second bearing member 63 has an inner opening in which the thread portion 61b of the screw 61 is inserted, and is inserted between the stiffener 54 and the holder 70. The second bearing member 63 allows the probe card 50 to have a stretchability with respect to the holder 70 in the horizontal direction.

Referring again to FIG. 1, the holder 70 holding the probe card 50 as described above is held by a ring-shaped adapter 80, and the adapter 80 is further held by an opening 92 formed at a top plate 91 of the prober 90. The adapter 80 is used for adapting to the opening 92 of the prober 90 probe cards 50 having different sizes in accordance with products category of the semiconductor wafer W under test and the shape of the test head 10, or the like. The probe card 50 side and the Hifix 11 side are mechanically connected to each other by engaging a hook 13 provided at the downside of the Hifix 11 with a hook 81 provided at the adapter 80.

The Hifix 11 is attached to the bottom of the test head 10. The Hifix 11 is provided with the connector 12 at the lower surface thereof. One end of the connector 12 is electrically connected with a coaxial cable which is electrically with the test head 10. Therefore, by connecting the connector 12 of the test head 10 side with the connector 53 provided with the probe card 50, the test head 10 is electrically connected with the probe card 50. For example, ZIF (Zero Insertion Force) connectors or the like may be used as the connectors 12 and 53.

The prober 90 has a carrier arm 93 for moving the semiconductor wafer W under test held by a suction stage in X-Y-Z directions and for rotating θ the wafer W around the Z-axis. In addition, a heater or the like as a thermal source 94 is embedded in the suction stage of the carrier arm 93, thereby enabling to heat the semiconductor wafer W held by suction. Alternatively, in the case of cooling the semiconductor wafer W under test during the testing of the IC device, a refrigerant may be circulated in the suction stage of the carrier arm 93.

During the test, the carrier arm 93 makes the semiconductor wafer W to face to the probe card 50 approaching into the prober 90 through the opening 92, and presses the semiconductor wafer W to the probe card 50. In this situation, the tester inputs a testing signal into the IC device embedded in the wafer W and receives a signal output from the IC device, thereby to execute the test of the IC device.

In this period, since the thermal source 94 heats the wafer W under test, the wafer W may thermally expand. In the present embodiment, when the semiconductor wafer W under test thermally expands, as shown in FIG. 3, balls of the bearing members 62 and 63 rotates, and the first bearing member 62 allows the probe card 50 to expand in the horizontal direction with respect to the screw 61 and the second bearing member 63 allows the probe card 50 to expand in the horizontal direction with respect to the holder 70 so as to escape the thermal expansion of the probe card 50 in the horizontal direction. As a result, the deformation of the probe card 50 in the vertical direction is reduced, and the front ends of the probe needles 51 become less variation in their heights.

It is to be noted that the fixing apparatus according to the present invention is not limited to the structure as described above.

Figure 4:
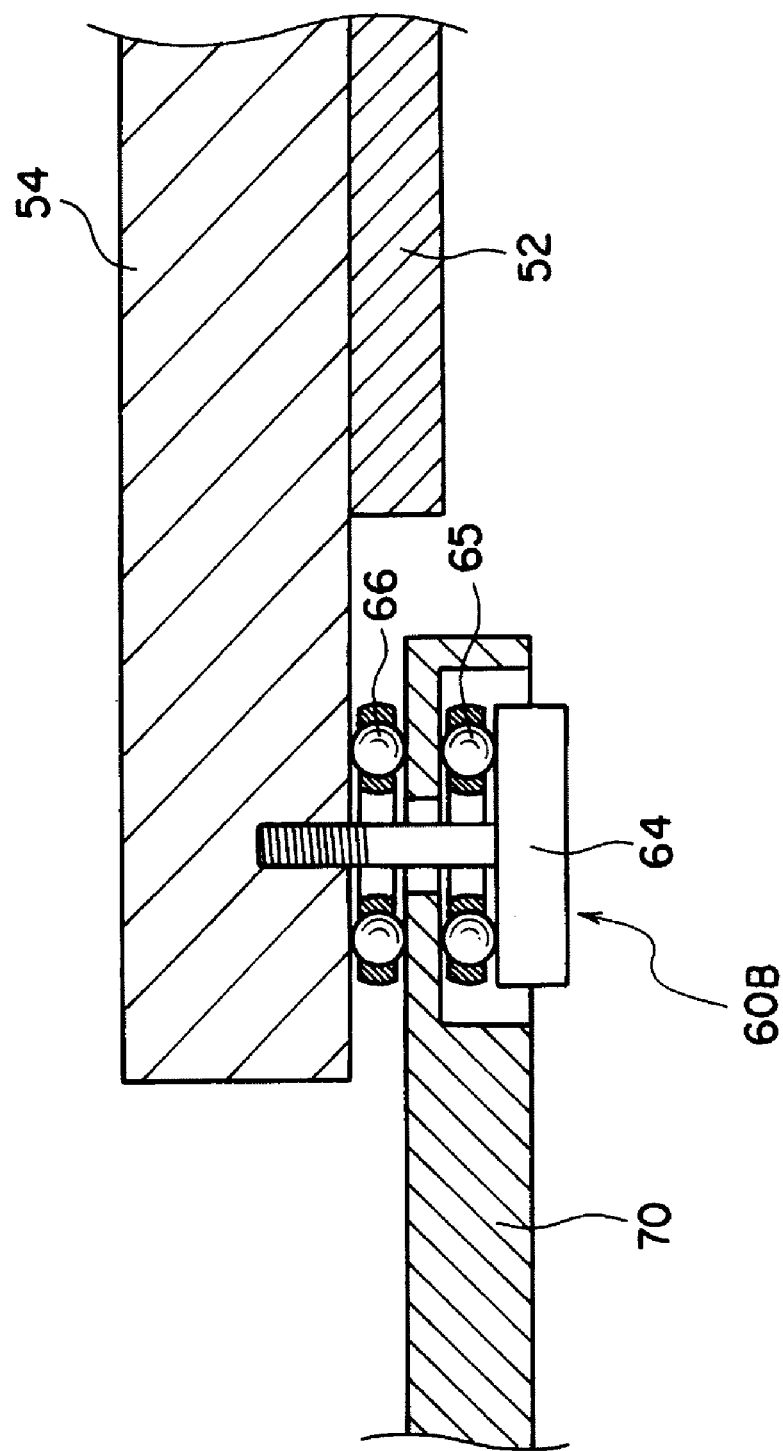
FIG. 4 is a schematic sectional view illustrating a fixing apparatus according to a second embodiment of the present invention.

FIG. 4 is a schematic sectional view illustrating a fixing apparatus according to a second embodiment of the present invention. A fixing apparatus 60B according to the second embodiment of the present invention includes, as shown in FIG. 4, similarly to the first embodiment, a screw 64 and two bearing members 65 and 66. The different points from the first embodiment are, however, that the screw 64 is fixed to the stiffener 54 through a through-hole formed in the holder 70, that the first bearing member 65 intervenes a head of the screw 64 and the holder 70, and that the second bearing member 66 intervenes the holder 70 and the stiffener 54.

In the present embodiment, when the semiconductor wafer W under test thermally expands, balls of the bearing members 65 and 66 rotates, and the first bearing member 65 allows a small movement of the screw 64 in the horizontal direction with respect to the holder 70 and the second bearing member 66 allows the probe card 50 to expand in the horizontal direction with respect to the holder 70 so as to escape the thermal expansion of the probe card 50 in the horizontal direction. As a result, the deformation of the probe card 50 in the vertical direction is reduced, and the front ends of the probe needles 51 become less variation in their heights.

Figure 5:
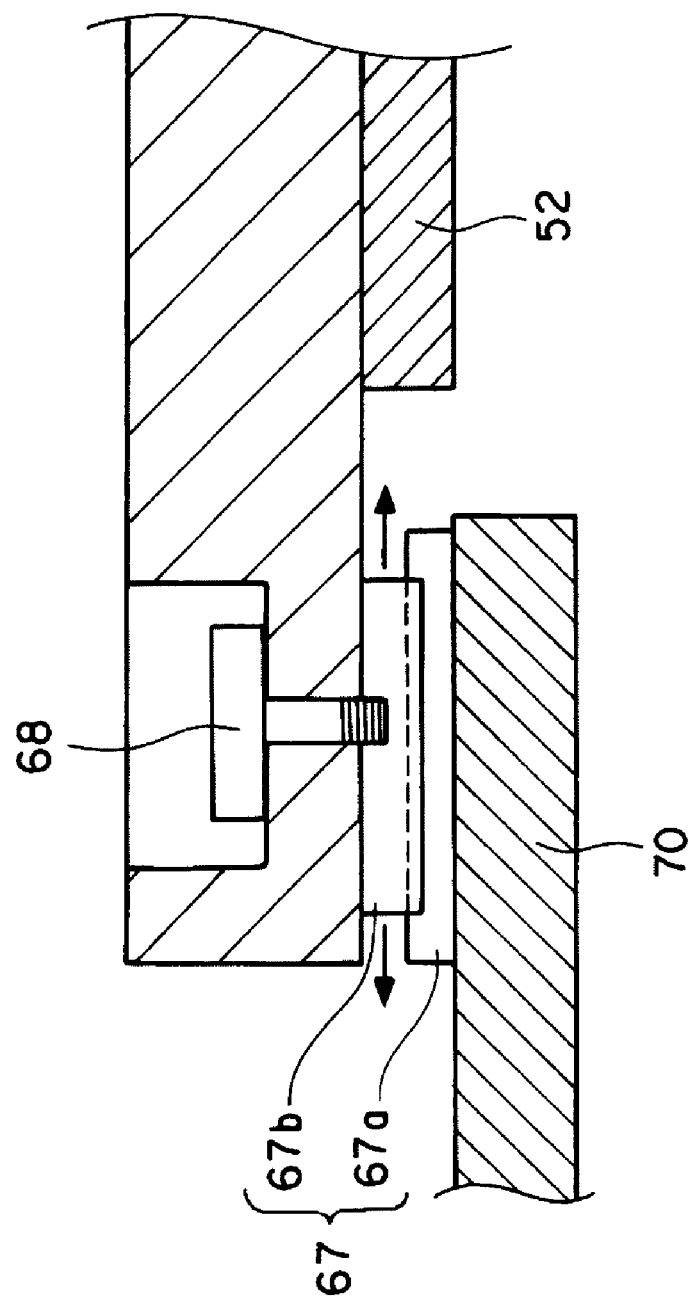
FIG. 5 is a schematic sectional view illustrating a fixing apparatus according to a third embodiment of the present invention.
Figure 6:
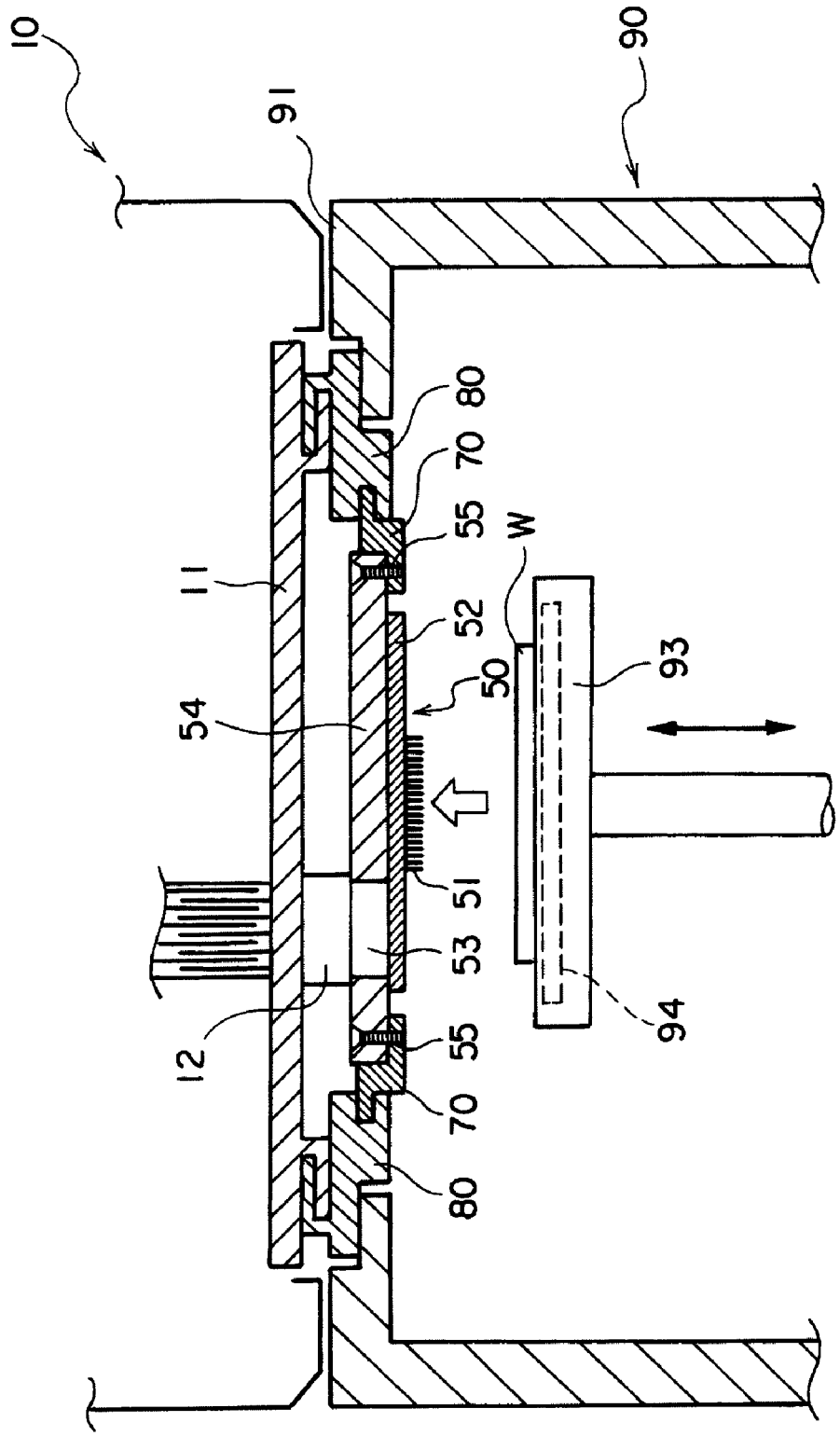
FIG. 6 is a schematic sectional view illustrating a structure of a prior art electronic device testing apparatus.
Figure 7A:
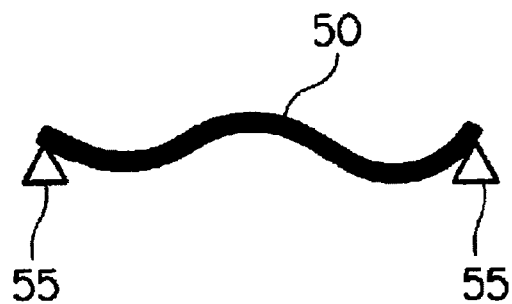
FIG. 7A is a view illustrating a deformation of the probe card caused by a thermal expansion thereof.
Figure 7B:
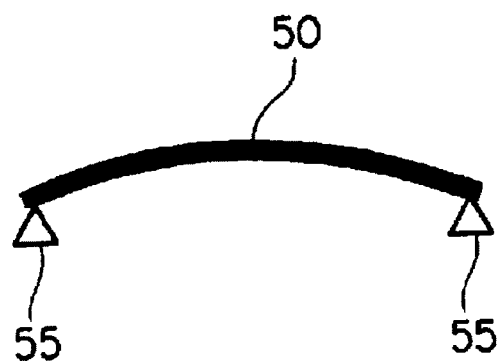
FIG. 7B is a view illustrating a deformation of the probe card caused by a thermal expansion thereof.
Figure 7C:
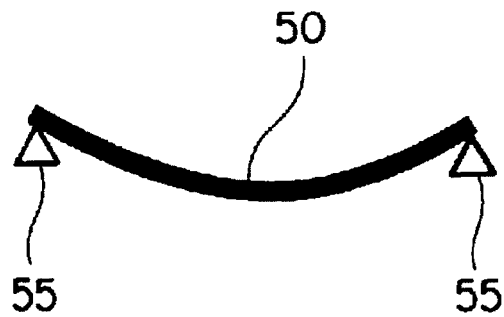
FIG. 7C is a view illustrating a deformation of the probe card caused by a thermal expansion thereof.

FIG. 5 is a schematic sectional view illustrating a fixing apparatus according to a third embodiment of the present invention. A fixing apparatus 60C according to the third embodiment of the present invention has a linear guide 67, as shown in FIG. 5. The linear guide 67 includes a guide rail 67a provided on an upper surface of the holder 70 along radial direction, and a sliding member 67b fixed to a lower surface of the probe card 50 by means of a screw and being able to slide on the guide rail 67a. The sliding member 67b is engaged with a groove formed on a side surface of the guide rail 67a in order to avoid removing of the sliding member 67b from the guide rail 67a in the vertical direction.

In the present embodiment, when the semiconductor wafer W under test thermally expands, the sliding member 67b slides on the guide rail 67a so as to escape the thermal expansion of the probe card 50 in the horizontal direction. As a result, the deformation of the probe card 50 in the vertical direction is reduced, and the front ends of the probe pins 51 become less variation in their heights. Alternatively, the guide rail 67a may be fixed to the lower surface of the stiffener 54 and the sliding member 67b may be fixed to the upper surface of the holder 70

Note that, the above explained embodiment was described for facilitating understanding of the present invention and was not described for limiting the present invention. Therefore, the elements disclosed in the above embodiment include all design changes and equivalents falling under the technical scope of the present invention.

For example, although it is described the case that the probe card 50 thermally expands in the above first to third embodiments, when the probe card 50 thermally contracts by cooling, the fixing apparatuses 60A to 60C allow the deformation of the probe card 50 to escape in the horizontal direction.

The invention claimed is:

1. A fixing apparatus for fixing a probe card to a holder, the fixing apparatus comprising:
    a binding device configured to bind the probe card onto the holder in a direction substantially perpendicular to a main surface of the probe card; and
    an allowing device configured to allow expansion and contraction of the probe card with respect to the holder in a direction substantially parallel to the main surface of the probe card, wherein
    the binding device is fixed to the holder, and
    the allowing device includes:
    a first bearing member intervening between the binding device and the probe card and allowing expansion and contraction of the probe card with respect to the binding device in the parallel direction; and
    a second bearing member intervening between the probe card and the holder and allowing expansion and contraction of the probe card with respect to the holder in the parallel direction.

2. The fixing apparatus as recited in claim 1, wherein the binding device includes a screw member being fixed to the holder via a through-hole formed on a stiffener of the probe card.

3. A testing apparatus for an electronic device, comprising:
    a testing apparatus main frame for testing a device under test formed on a semiconductor wafer;
    a probe card for establishing an electrical connection between the device under test and the testing apparatus main frame;
    a prober for pressing the probe card onto the semiconductor wafer; and
    a holder for fixing the probe card to the prober, wherein
    the probe card is fixed to the holder by using the fixing apparatuses as recited in claim 1.

4. A fixing apparatus for fixing a probe card to a holder, the fixing apparatus comprising:
    a binding device configured to bind the probe card onto the holder in a direction substantially perpendicular to a main surface of the probe card; and an allowing device configured to allow expansion and contraction of the probe card with respect to the holder in a direction substantially parallel to the main surface of the probe card, wherein the binding device is fixed to the probe card, and the allowing device includes:

a first bearing member intervening between the binding device and the holder and allowing a small movement of the binding device with respect to the holder in the parallel direction; and a second bearing member intervening between the holder and the probe card and allowing expansion and contraction of the probe card with respect to the holder in the parallel direction.

5. The fixing apparatus as recited in claim 4, wherein the binding device includes a screw member being fixed to a stiffener of the probe card via a through-hole formed on the holder.

6. A testing apparatus for an electronic device, comprising:

a testing apparatus main frame for testing a device under test formed on a semiconductor wafer;

a probe card for establishing an electrical connection between the device under test and the testing apparatus main frame;

a prober for pressing the probe card onto the semiconductor wafer; and a holder for fixing the probe card to the prober, wherein the probe card is fixed to the holder by using the fixing apparatuses as recited in claim 4.

7. A fixing apparatus for fixing a probe card to a holder, the fixing apparatus comprising:

a guiding member provided on one of the probe card or the holder along the direction substantially parallel to the main surface of the probe card; and a sliding member provided on another of the holder or the probe card, engaged with the guiding member in the direction perpendicular to the main surface of the probe card and being able to slide on the guiding member, wherein the probe card is provided stretchably with respect to the holder in a direction substantially parallel to a main surface of the probe card, and the probe card is bound onto the holder in a direction substantially perpendicular to the main surface of the probe card.

8. A testing apparatus for an electronic device, comprising:

a testing apparatus main frame for testing a device under test formed on a semiconductor wafer;

a probe card for establishing an electrical connection between the device under test and the testing apparatus main frame;

a prober for pressing the probe card onto the semiconductor wafer; and a holder for fixing the probe card to the prober, wherein the probe card is fixed to the holder by using the fixing apparatuses as recited in claim 7.

* * * * *